United States Patent
Olding et al.

(10) Patent No.: US 7,259,788 B1
(45) Date of Patent: Aug. 21, 2007

(54) IMAGE SENSOR AND METHOD FOR IMPLEMENTING OPTICAL SUMMING USING SELECTIVELY TRANSMISSIVE FILTERS

(75) Inventors: Benjamin P. Olding, Redwood City, CA (US); Michael Frank, Sunnyvale, CA (US)

(73) Assignee: PIXIM, Inc., Mountain View, CA (US)

( * ) Notice: Subject to any disclaimer, the term of this patent is extended or adjusted under 35 U.S.C. 154(b) by 1182 days.

(21) Appl. No.: 10/058,638

(22) Filed: Jan. 28, 2002

(51) Int. Cl.
 *H04N 3/14* (2006.01)
(52) U.S. Cl. ........................ 348/273; 348/277; 348/278
(58) Field of Classification Search ............. 348/218.1, 348/219.1, 269, 270, 271, 272, 268, 274, 348/277, 273
 See application file for complete search history.

(56) References Cited

U.S. PATENT DOCUMENTS

| | | | | |
|---|---|---|---|---|
| 4,403,247 A | * | 9/1983 | Sone et al. | 348/276 |
| 5,461,425 A | * | 10/1995 | Fowler et al. | 348/294 |
| 5,548,333 A | * | 8/1996 | Shibazaki et al. | 348/270 |
| 5,703,641 A | * | 12/1997 | Watanabe | 348/274 |
| 6,137,100 A | * | 10/2000 | Fossum et al. | 250/208.1 |

* cited by examiner

*Primary Examiner*—Ngoc-Yen Vu
*Assistant Examiner*—Gary C. Vieaux
(74) *Attorney, Agent, or Firm*—Patent Law Group LLP; Carmen C. Cook (57) ABSTRACT

An image sensor includes a two-dimensional array of pixel elements where the array of pixel elements outputting pixel data representing an image of a scene, and a two-dimensional array of selectively transmissive filters superimposed on the two-dimensional array of pixel elements, whereby each pixel element in the array of pixel elements is disposed to capture a first and a second color spectra of visible light. In one embodiment, the image sensor is a digital pixel sensor where the array of pixel elements is a sensor array of digital pixels, each of the digital pixels outputting digital signals as pixel data. In another embodiment, the pixel elements of the image sensor output analog signals as pixel data. In this manner, light intensity values for two different color spectra are optically summed at the pixel level, providing pixel values that are suitable for use in interlaced video display. The image sensor of the present invention has applications in video cameras employing the CMYG (cyan, magenta, yellow, and green) interlaced capture scheme for capturing full color video images.

7 Claims, 7 Drawing Sheets

IMAGE SENSOR AND METHOD FOR IMPLEMENTING OPTICAL SUMMING USING SELECTIVELY TRANSMISSIVE FILTERS

BACKGROUND OF THE INVENTION

1. Field of the Invention

The invention relates to interlaced video display, and more particularly to an image sensor for displaying interlaced video using optical summing.

2. Description of the Related Art

Figure 1:
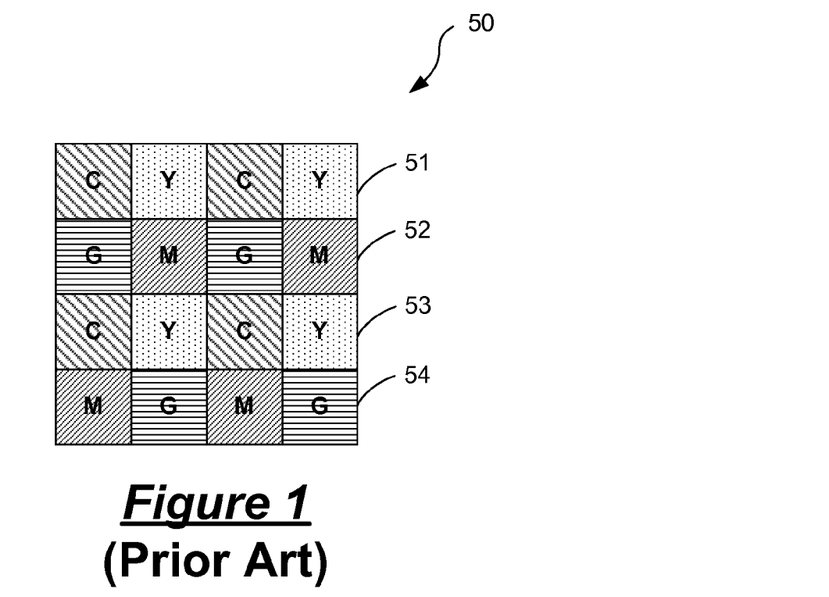
FIG. 1 illustrates a typical CMYG filter pattern used in conventional video cameras.

In full color video applications, video cameras typically employ the CMYG (Cyan, Magenta, Yellow, and Green) filter pattern for capturing full color video images. The CMYG filter scheme is preferred over the traditional RGB (Red, Green, Blue) primary color scheme because the CMYG filters have higher transparency (which results in higher sensitivity) and because the use of CMYG colors simplifies post-capture image processing. FIG. 1 illustrates a typical CMYG filter pattern used in conventional video cameras. CMYG filter pattern 50 includes alternating rows of cyan/yellow filters (rows 51 and 53) and green/magenta filters (rows 52 and 54). In the second row of green/magenta filters (row 54), the positions of the green and magenta filters are switched so that a magenta filter is positioned below a cyan filter of the row above and a green filter is positioned below a yellow filter of the row above. The 4 by 4 block of filter pattern 50 is repeated to cover the entire array of pixel elements in the image sensor of the video camera.

Video cameras output video data in an interlaced format because most display monitors display video data in an interlaced format. That is, video data are outputted by alternating between two data fields, an odd field and an even field, every $\frac{1}{60}^{th}$ of a second. Video data associated with the odd rows of the image sensor are outputted in the odd field while video data associated with the even rows of the image sensor are outputted in the even field. The odd and even data fields are thus interlaced. Each of the odd and even data fields has a resolution that is half the vertical resolution of the image sensor. For example, if the image sensor has a resolution of 720 columns by 480 rows of pixel elements, each data field output a video image having a resolution of 720 by 240.

To generate interlaced video data, the entire field of the image sensor is used. In operation, the image sensor captures a frame of image data and pixels values in adjacent rows of the image sensor are summed to generate the video data for either the odd or the even data field. Then, the image sensor captures another frame of image data and pixel values in the alternate, adjacent rows of the image sensor are summed to generate the video data for the other data field.

Figure 2:
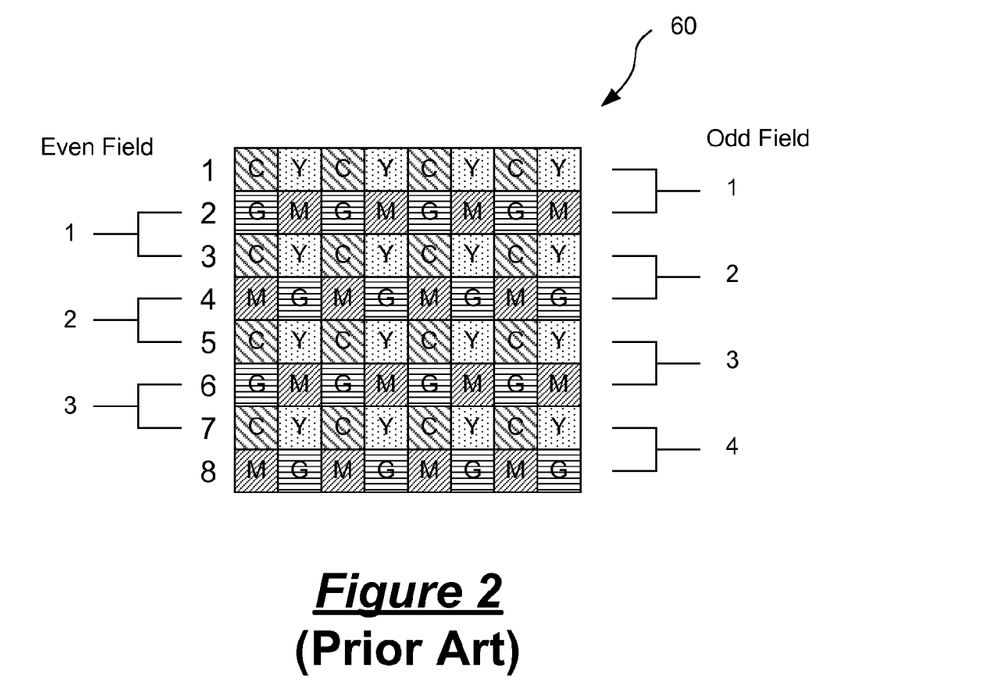
FIG. 2 illustrates the summing operation for generating the interlaced video data in an image sensor overlaid with the CMYG filter pattern of FIG. 1.

FIG. 2 illustrates the summing operation for generating the interlaced video data in an image sensor overlaid with the CMYG filter pattern of FIG. 1. The video data capture scheme is referred to as the CMYG interlaced capture scheme. Referring to FIG. 2, image sensor 60 is illustrated as having 8 rows and 8 columns of pixel elements. To generate the odd field image, pixel data in adjacent pixel elements in rows 1 and 2, rows 3 and 4, rows 5 and 6 and rows 7 and 8 are summed, resulting in four rows of interlaced video data. For the even filed image, pixel data in adjacent pixel elements in rows 2 and 3, rows 4 and 5, and rows 6 and 7 are summed, resulting in another four rows of interlaced video data.

Figure 3:
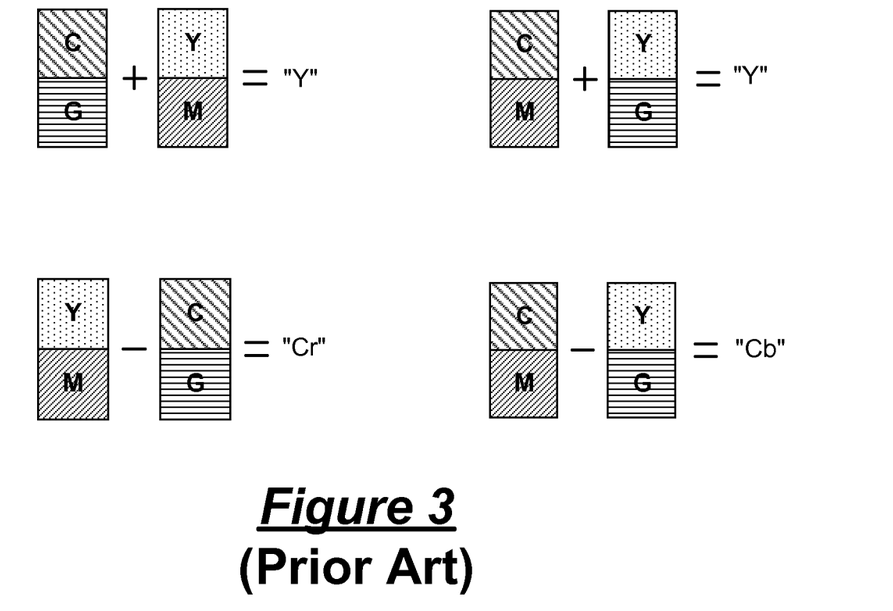
FIG. 3 illustrates the interpolation operation involved in converting the pixel data in CMYG color space to the YCbCr color space.

Because video output signals are typically given in the YCbCr color space, post-capture image processing is performed to convert the pixel data captured in the CMYG color space to the YCbCr color space. (In the following description, the italic letter *Y* is used to denote the luminance channel in the YCbCr color space while the letter Y is used to denote the color yellow in the CMYG color space.) Color interpolation from CMYG to YCbCr is well known. FIG. 3 illustrates the interpolation operation involved in converting the pixel data in CMYG color space to the YCbCr color space.

Referring to FIG. 3, the luminance channel *Y* is estimated by adding pixel values in adjacent columns of pixels. For example, for the odd field, the luminance channel *Y* for the first row is the sum of (C+G) and (Y+M) while the luminance channel *Y* in the second row is the sum of (C+M) and (Y+G). The chrominance channels Cb and Cr are estimated by subtracting pixel values in adjacent columns of pixels, as shown in FIG. 3. The chrominance channel Cr is the difference of (Y+M) and (C+G) while the chrominance channel Cb is the difference of (C+M) and (Y+G). In this manner, the luminance channel *Y* is estimated at the intersection of every pixel while the chrominance channels Cb and Cr are estimated at every other pixel to form the desired color demosaic. The color interpolation for the even field operates in the same manner as in the odd field. The even field has a different color filter ordering but the same combination of rows.

The use of the CMYG interlaced capture scheme has several advantages over the traditional RGB capture scheme. First, the CMYG color filters, being complementary colors and spanning a broader spectrum of light frequencies, are capable of capturing more light than RGB filters. Thus, the sensitivity of the image sensor can be enhanced. Second, post-capture image processing is simplified. By using the CMYG filter pattern, video data output in the desired YCbCr color space can be obtained readily. Specifically, only one adder is needed to interpolate the luminance *Y* channel and only one subtractor is need to interpolate either of the chrominance channel Cb or Cr. Thus, the interpolation operation is computationally simple and can be performed at a very fast speed. High-speed interpolation is particularly important for video images as the output rate is one data field per $\frac{1}{60}^{th}$ of a second.

Finally, by summing pixel values of adjacent rows, the image sensor's sensitivity can be increased. This is true for image sensors where pixel data are measured in analog form and converted to digital values by circuits outside of the image sensor array, such as CCD or APS image sensors. In an CCD image sensor, charge accumulates in each pixel element. The summing of the analog pixel values has the effect of increasing the photo-sensitive area of the pixel cell, albeit under two different color filters. By summing the analog pixel values of adjacent pixels and then digitizing the summed value, inaccuracy due to quantization noise can be avoided.

However, when the image sensor in the video camera is one in which pixel-level analog-to-digital conversion (ADC) is performed, the summing operation has to be performed using the digitized pixel values. Summing digitized pixel values has several disadvantages. First, the summing operation will become more computationally complex. The digital values have to be added using a data processor. Second, because of quantization noise in the digitized signals, the effective sensitivity of the image sensor is decreased.

Therefore, it is desirable to provide an alternate implementation of the CMYG interlace capture scheme in an image sensor to avoid the aforementioned disadvantages.

SUMMARY OF THE INVENTION

According to one embodiment of the present invention, an image sensor includes a two-dimensional array of pixel elements where the array of pixel elements outputting pixel data representing an image of a scene, and a two-dimensional array of selectively transmissive filters superimposed on the two-dimensional array of pixel elements, whereby each pixel element in the array of pixel elements is disposed to capture a first and a second color spectra of visible light.

In operation, light intensity values for two different color spectra are optically summed at the pixel level, providing pixel values that are suitable for use in interlaced video display. The image sensor of the present invention has applications in a video camera employing the CMYG (cyan, magenta, yellow, and green) interlaced capture scheme for capturing full color video images.

In one embodiment, the two-dimensional array of pixel elements is a sensor array of digital pixels where each of the digital pixels outputs digital signals as pixel data. In another embodiment, the pixel elements in the array of pixel elements generates analog signals as pixel data.

According to another aspect of the present invention, a method for generating electrical signals representing an image in an image sensor where the image sensor includes an array of pixel elements overlaid with an array of selectively transmissive color filters includes the step of generating at each pixel element pixel data indicative of the light intensity impinging on the pixel element, where the pixel data is a sum of the light intensity of a first color spectrum and a second color spectrum of visible light.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

In accordance with the principles of the present invention, an image sensor includes an array of pixel elements overlaid with an array of selectively transmissive color filters so that each pixel element can sense two or more color spectra of visible light. In this manner, light intensity values for two different color spectra are optically summed at the pixel level, providing pixel values that are suitable for use in interlaced video display. In one embodiment, the array of selectively transmissive filters is shifted so that each pixel element is overlaid with two different transmissive color filters. Each pixel element is thus disposed to capture incident light of two colors. In another embodiment, each filter cell of the array of transmissive filters is a composite filter capable of transmitting transmit light in two or more color spectra. Each composite filter cell overlies a pixel element so that each pixel element operate to capture two color spectra of visible light.

Figure 4:
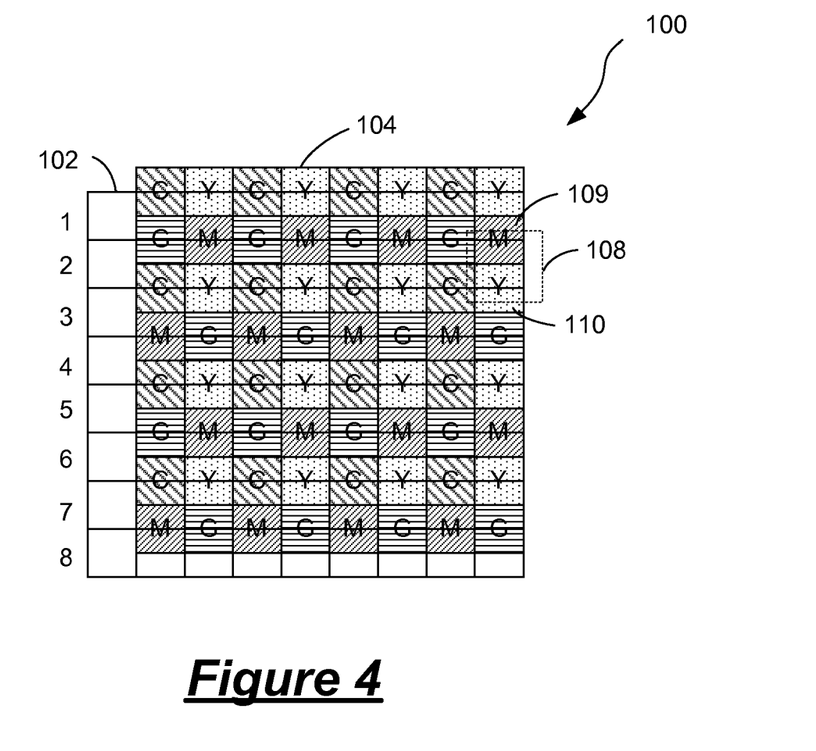
FIG. 4 illustrates an image sensor according to one embodiment of the present invention.

FIG. 4 illustrates an image sensor 100 according to one embodiment of the present invention. Image sensor 100 includes a two-dimensional array of pixel elements 102 and a two-dimensional array of selectively transmissive filters, also referred to as a color filter array 104. In the present embodiment, color filter array 104 is in offset registration with the array of pixel elements so that each color filter overlies two adjacent pixel elements in a column. Referring to FIG. 4, color filter array 104 is shifted vertically by half a pixel so that each color filter overlies a portion of the active area of two adjacent pixel elements. Alternately, each pixel element can be viewed as being overlaid by two color filters. For example, a pixel element 108 is overlaid with a magenta filter 109 on the top and a yellow filter 110 on the bottom. By superimposing two color filters on each pixel element, optically summing of the light intensity values from the two different color filters can be accomplished.

Figure 5:
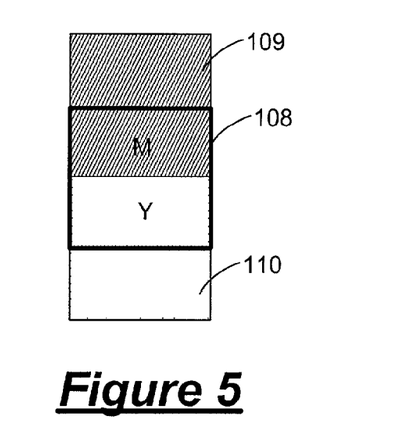
FIG. 5 is an enlarged view of a pixel element overlaid with two transmissive color filters according to one embodiment of the present invention.
Figure 6:
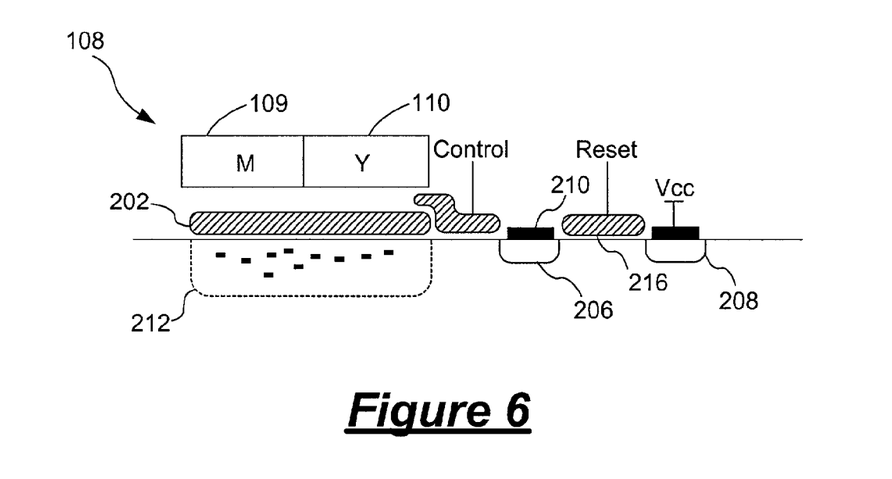
FIG. 6 is a cross-sectional view of a pixel element and the associated color filters according to one embodiment of the present invention.

FIG. 5 is an enlarged view of pixel element 108 overlaid with two transmissive color filters 109 and 110, according to one embodiment of the present invention. In the present embodiment, color filter array 104 is shifted by half a pixel so that each color filter overlies half of pixel element 108. FIG. 6 is a cross-sectional view of a pixel element and the associated color filters according to one embodiment of the present invention. In FIG. 6, pixel element 108 is implemented as a photodiode including a photogate 202 which accumulate charges in the substrate area 212. Pixel element 108 may also include other components, such as a control gate, a sense node 210 and a reset transistor 216. Photogate 202 is overlaid with two color filters 109 and 110. In operation, when incident light impinges upon pixel element 108, filter 109 will transmit light in the frequency range of the magenta color spectrum and filter 110 will transmit light in the frequency range of the yellow color spectrum. Photogate 202 collects charges representative of the light intensity values of the sum of the magenta color and the yellow color. In this manner, pixel-level optical summing of the light intensity values of the magenta color and the yellow color is accomplished.

Figure 7:
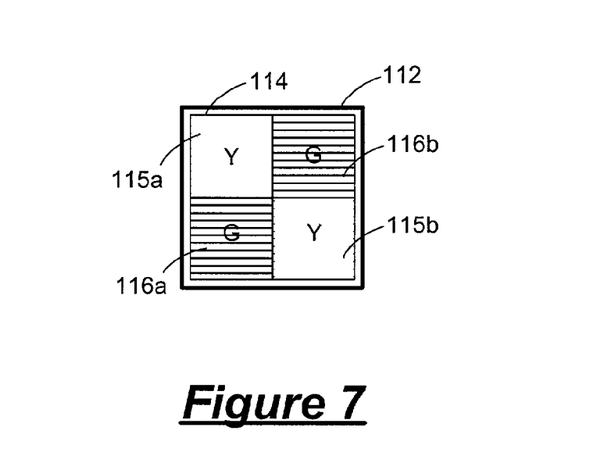
FIG. 7 illustrates another embodiment of the present invention where pixel-level optical summing is accomplished using a color filter array including filter cells.

FIG. 4 illustrate one embodiment of the present invention where pixel-level optical summing is realized by shifting the alignment of the color filter array with respect to the array of pixel elements. Other embodiments for realizing pixel-level optical summing are possible. FIG. 7 illustrates another embodiment of the present invention where pixel-level optical summing is accomplished using a color filter array including filter cells. In the embodiment shown in FIG. 7, instead of offsetting the color filter array to achieve pixel-level optical summing, image sensor 100 includes a color filter array having a predefined filter pattern. Specifically, the color filter array is made up of an array of filter cells where each filter cell incorporates two filter types.

Referring to FIG. 7, a pixel element 112 in the array of pixel elements is overlaid by a filter cell 114 in the color filter array. Filter cell 114 includes two types of filters: a yellow filter 115 and a green filter 116. Filter cell 114 is divided into four quadrants and each of filter 115 and 116 occupies two quadrants of the filter cell. In the present embodiment, yellow filter 115 occupies two quadrants that are diagonal to each other (quadrants 115a and 115b) and green filter 116 occupies the two remaining quadrants that are also diagonal to each other (quadrants 116a and 116b). Filter cells incorporating other combinations of filter types, such as cyan and magenta, are formed so as to create the desired color mosaic for the color filter array.

The use of filter cells in the color filter array of image sensor 100 to incorporate two filter types at each pixel location has advantages in that the alignment of the color filter array to the array of pixel elements is less critical. When the color filter array is shifted by half pixel to achieve optical summing (FIG. 4), the alignment of the color filter array to the array of pixel elements must be precisely done to ensure that each pixel location is overlaid with the correct proportion of filter material. However, when a color filter array including filter cells such as filter cell 112 (FIG. 7) is used, the color filter array can be readily aligned with the array of pixel elements and the precision of alignment becomes less critical.

According to yet another embodiment of the present invention, the image sensor of the present invention includes a color filter array made up of composite filter cells. In the present description, a composite filter or a composite filter cell is a filter designed to transmit light in two or more color spectra. In other words, a composite filter has the same spectral response as the combination of the spectral response of two different color filters.

Figure 8A:
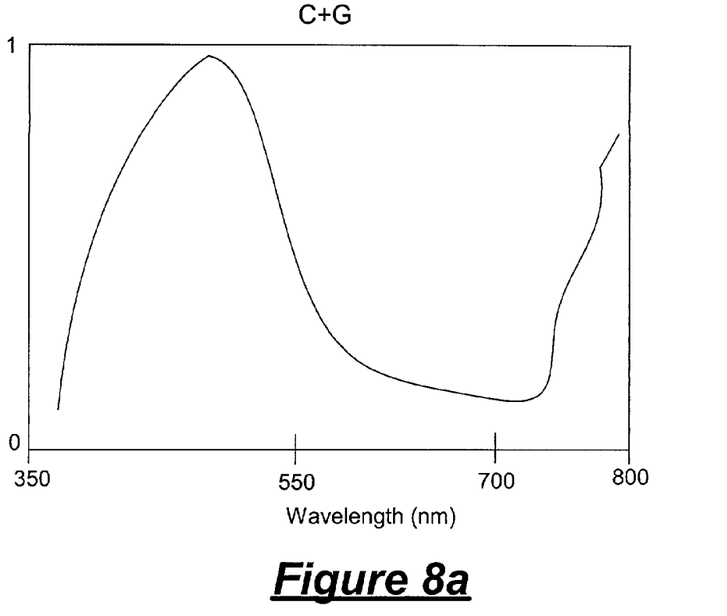
FIGS. 8a to 8d are curves illustrating the spectral responses which can be used to define the four composite filters for use in the CMYG interlaced capture scheme.
Figure 8B:
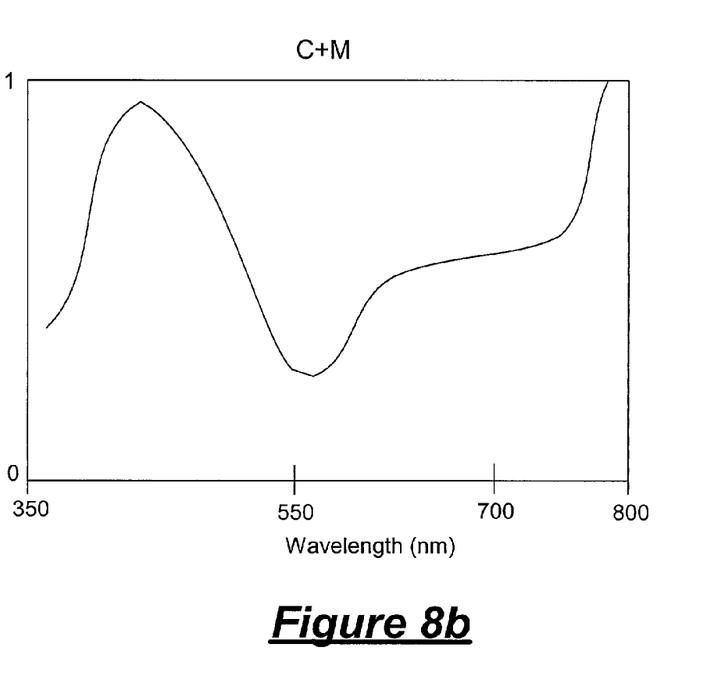
Figure 8C:
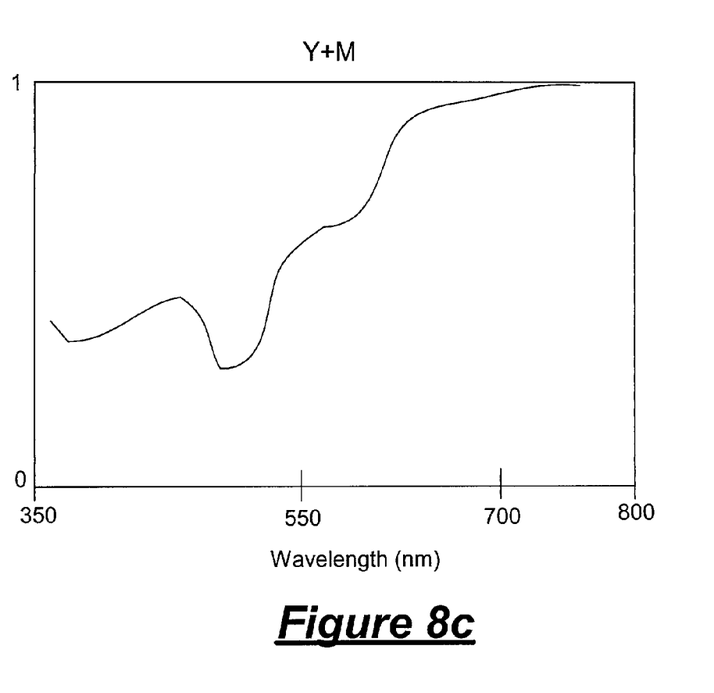
Figure 8D:
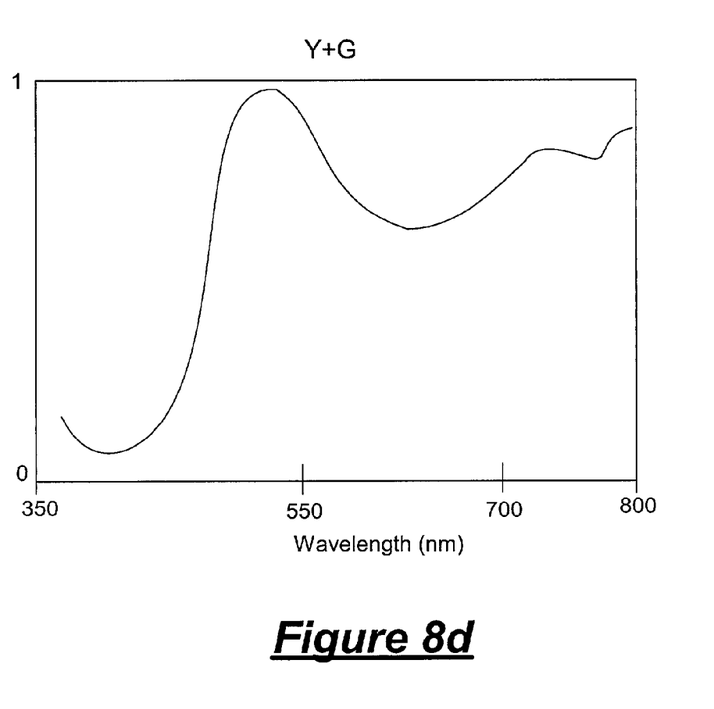

In order to realize the CMYG filter pattern for facilitating CMYG interlaced capture scheme, four composite filters are required. Specifically, a C+G composite filter, a C+M composite filter, a Y+M composite filter and a Y+G composite filter are required. The desired spectral response for a composite filter can be found by adding the spectral response of the individual colors and normalizing the resultant response to one. FIGS. 8a to 8d are curves illustrating the spectral responses which can be used to define the four composite filters for use in the CMYG interlaced capture scheme. FIG. 8a illustrates the spectral response for a C+G composite filter. FIG. 8b illustrates the spectral response for a C+M composite filter. FIG. 8c illustrates the spectral response for a Y+M composite filter. FIG. 8d illustrates the spectral response for a Y+G composite filter. The composite filters can be manufactured by applying the correct amount of chemicals to obtain the desired spectral response for each composite filter.

Figure 9:
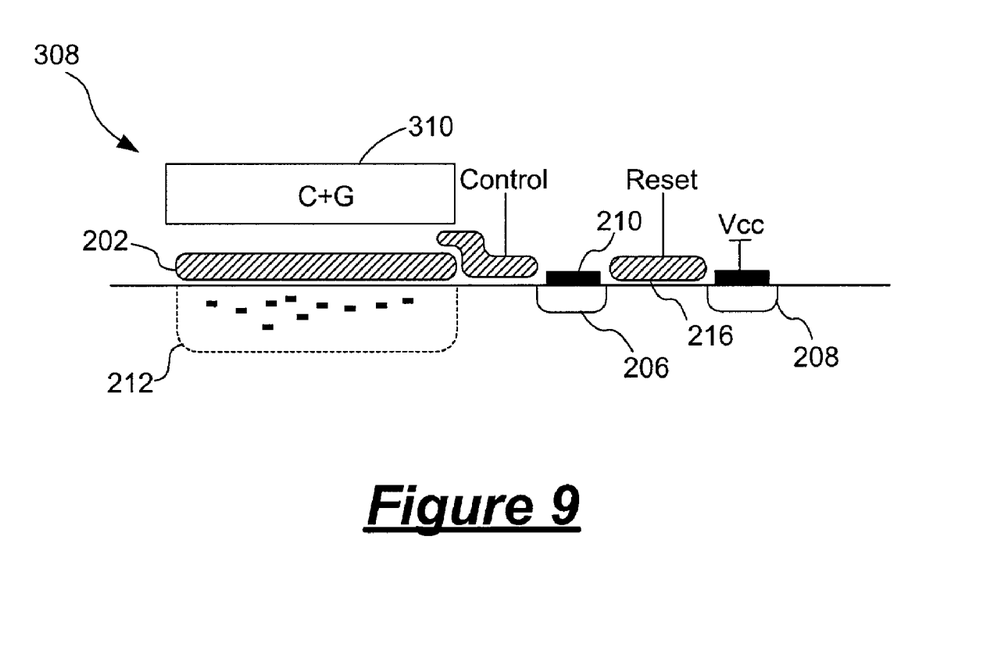
FIG. 9 is a cross-sectional view of a pixel element and an associated composite color filter according to one embodiment of the present invention.

Having defined the appropriate spectral response for each of the composite filter types, a color filter array can be formed by arranging the composite filter cells to form the desired CMYG filter pattern. Each filter cell is in registration with each pixel element in the image sensor. FIG. 9 is a cross-sectional view of a pixel element and an associated composite color filter according to one embodiment of the present invention. In FIG. 9, the pixel element 308 is implemented as a photodiode in the same manner as the photodiode in FIG. 6. Like elements in FIGS. 6 and 9 are given like reference numerals. A composite filter cell 310 having a spectral response of C+G overlies photogate 202. Thus, when pixel element 308 is exposed to incident light, photogate 202 accumulates charges that are indicative of the light intensity value of the cyan and the green color spectra. In this manner, optical summing of the light intensity of the cyan color and the green color is accomplished through the use of a composite filter.

The use of a composite filter in the image sensor of the present invention to facilitate optical summing has several advantages. First, the color filter array can be readily aligned with the array of pixel elements and precise alignment of filter cells to the pixel elements is not critical. Second, by providing a composite filter instead of using two or more adjoining filters, any reflection from the internal interface of the adjoining filters can be entirely avoided.

The image sensor of the present invention is an area image sensor that can be implemented as a charged-coupled device (CCD) or a Complementary Metal-Oxide Semiconductor (CMOS) image sensor. CMOS image sensors may include active pixel sensors (APS) and digital pixel sensors (DPS). The image sensor of the present invention can be implemented using any image sensors, presently available or to be developed. Typically, the image sensor includes a two-dimensional array of light detecting elements, also called photodetectors.

CCD and APS image sensors are well known in the art. The operation of CCD image sensors and APS image sensors are similar in that both types of image sensors operate to produce an analog output signal at each pixel. If the image sensor of the present invention is an analog image sensor such as a CCD image sensor, then the image sensor may include additional circuitry such as a readout and control circuits including an analog-to-digital converter (ADC) for converting the analog image signals into digital signals.

Figure 10:
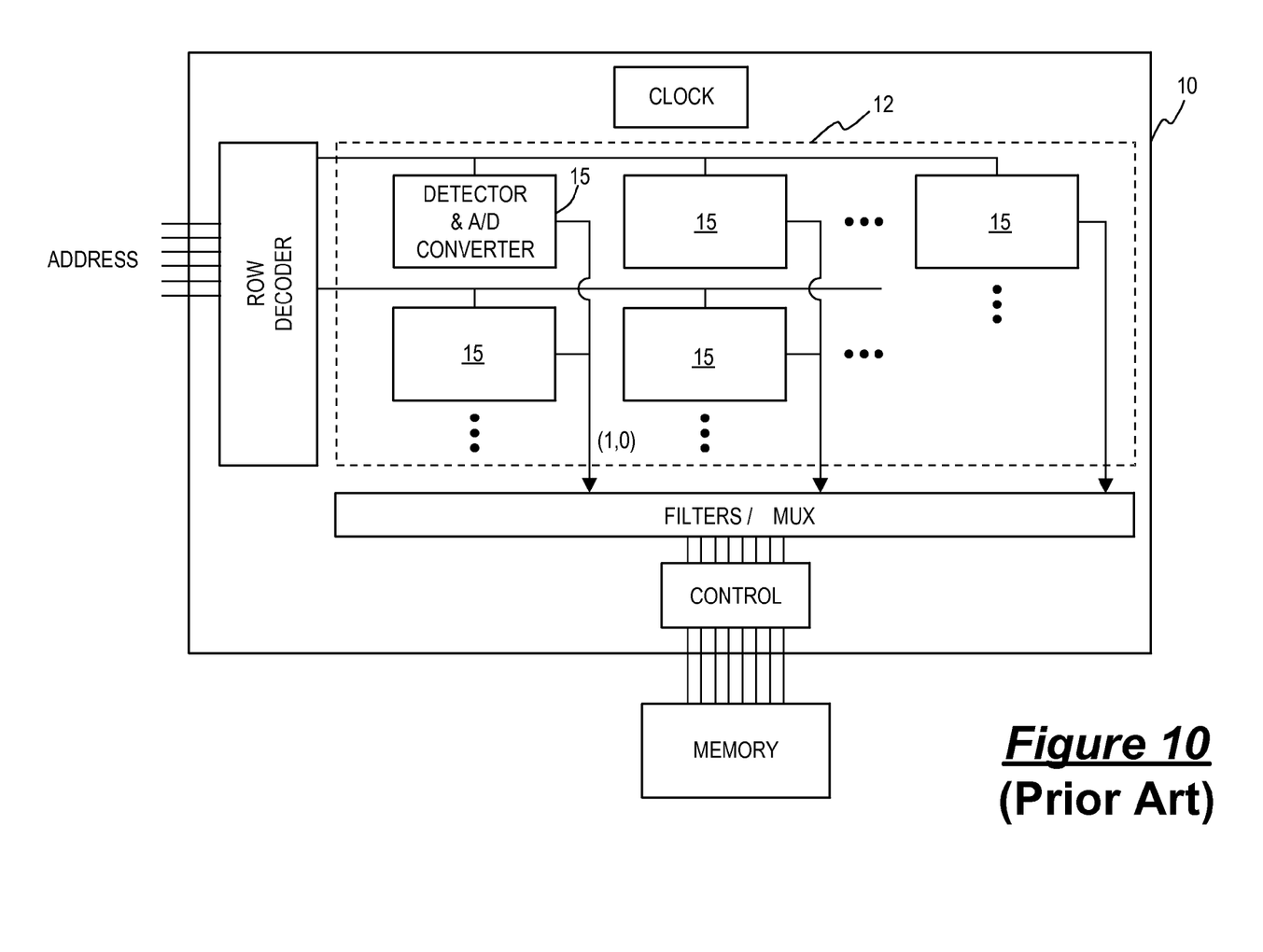
FIG. 10 illustrates the digital pixel sensor architecture used in the '425 patent which may be used to practice the apparatus and method of the present invention.

In the present embodiment, the image sensor of the present invention is a digital pixel sensor (DPS). A CMOS image sensor with pixel level analog-to-digital conversion is described in U.S. Pat. No. 5,461,425 of B. Fowler et al. (the '425 patent), which reference is incorporated herein by reference in its entirety. FIG. 10 duplicates FIG. 1 of the '425 patent and illustrates the digital pixel sensor architecture used in the '425 patent which may be used to practice the apparatus and method of the present invention. In FIG. 10, image sensor 10 is referred to herein as a digital pixel sensor (DPS) which provides a digital output signal at each pixel element (e.g. element 15) representing the light intensity detected by that pixel element. The combination of a photodetector and an analog-to-digital (A/D) converter in an area image sensor affords many useful features that a conventional image sensor could not readily accomplish.

In the present description, a digital pixel sensor (DPS) array or a sensor array refers to a digital image sensor having an array of photodetectors where each photodetector produces a digital output signal. The pixels of a DPS array are sometimes referred to as a "sensor pixel" or a "sensor element" or a "digital pixel," which terms are used to indicate that the output of each pixel is in digital form, and is distinguishable from a conventional photodetector which includes a photodetector and produces an analog signal. Depending on an exact implementation, an analog-to-digital circuit may be included in a sensor element or a portion from several neighboring sensor elements forms a circuit that performs an analog-to-digital conversion. In any case, each of the sensor elements is capable of producing digital output signals of high fidelity. The digital output signals of a DPS array have many advantages over the conventional analog signals, one of which is that the digital signals can be read out at a much higher speed. Of course, other schemes for implementing a pixel level A/D conversion in an area image sensor may also be used in the image sensor of the present invention.

In the present embodiment, the image sensor may include a data memory for storing the digital output signals from the sensor array. The data memory can be built on the same integrated circuit as the image sensor or it can be built on a separate integrated circuit from the image sensor. In one embodiment, the data memory is an integrated on-chip memory of the image sensor and has the capacity for storing at least one frame of image data from the sensor array. U.S. patent application Ser. No. 09/567,638 describes an integrated digital pixel sensor (DPS) with an on-chip memory for storing at least a frame of image data. The incorporation of an on-chip memory in an image sensor alleviates the data transmission bottleneck problem associated with the use of an off-chip memory for storage of the pixel data. The aforementioned patent application is incorporated herein by reference in its entirety.

The image sensor of the present invention employing optical summing in the pixel elements provides advantages over the conventional image sensor for generating interlaced video data.

First, when the image sensor of the present invention is applied in a video camera, interlaced video data can be readily generated. Because each row of pixel elements in the image sensor includes the optical sum of the pixel values of two vertically adjacent color filters in the CMYG pattern, the odd field or the even field of the interlaced video data can be generated by reading out pixel values from every other row of image sensor 100.

For instance, referring to FIG. 4, to generate the odd field, pixel data from the odd rows (i.e., rows 1, 3 and 5) of image sensor 100 are read out. To generate the even field, pixel data from the even rows (i.e., rows 2, 4 and 6) of image sensor 100 are read out. In the present description, the terms "odd rows" and "even rows" are used to refer to a first set of alternate rows and a second set of alternate rows in the image sensor different than the first set. The use of the terms "odd rows" and "even rows" is not intended to limit the set of alternate rows to those rows that are numerically numbered with odd numbers or even numbers.

Second, by optically summing pixel data of two different colors at each pixel location, an interlaced frame is created by every other rows in the image sensor. Thus, to generate the odd field or the even field images, only half the rows of the image sensor are read out. Thus, while half the rows are being read out to generate the video data for one data field (the odd or the even field), the other half of the rows can continue to be exposed to the incident light, thereby increasing the integration time. For instances, the typical interlaced data rate for video display is $\frac{1}{60}^{th}$ of a second. Thus, in a conventional image sensor, the integration time for each data field is $\frac{1}{60}^{th}$ of a second. When optical summing in accordance with the present invention is applied, each field can be exposed to a full $\frac{1}{30}^{th}$ of a second, effectively doubling the integration time and the sensitivity of the image sensor.

Third, the optical summing technique of the present invention is particularly useful when applied in a DPS image sensor. When the CMYG interlaced capture scheme is applied to a DPS image sensor, pixel values of two adjacent rows are digitized at each pixel location and then the digital values are summed. Summing digitized pixel values can lead to inaccuracy due to quantization noise. In accordance with the present invention, optical summing of pixel values is performed during the light integration process. Therefore, when the DPS image sensor digitizes the pixel value at each pixel location, the pixel value is already a summed value of two adjacent filter colors. By applying the optical summing technique of the present invention in a digital pixel sensor, the accuracy and sensitivity of the image sensor can be enhanced.

In the image sensor of the present invention, the spatial sampling rate is different than in the traditional interlaced data capture scheme. In the image sensor of the present invention, only half the sensor area is used for a given data field. In the event that this spatial sampling creates aliasing artifacts, a simple blur function can be added to the processing to eliminate the imaging artifacts.

The above detailed descriptions are provided to illustrate specific embodiments of the present invention and are not intended to be limiting. Numerous modifications and variations within the scope of the present invention are possible. For example, in the above descriptions, the alternate rows of the image sensor are referred to as odd rows and even rows for ease of reference. The notations of odd rows and even rows do not refer to the numeric numbering of the rows. The present invention is defined by the appended claims.

We claim:

1. An image sensor, comprising:
   a two-dimensional array of pixel elements, said array of pixel elements outputting pixel data representing an image of a scene; and
   a two-dimensional array of selectively transmissive filters superimposed on said two-dimensional array of pixel elements, whereby each pixel element in said array of pixel elements is disposed to capture a first and a second color spectra of visible light,
   wherein said two-dimensional array of selectively transmissive filters comprises a two-dimensional array of filter cells, each filter cell superimposed and in registration with each of said pixel elements, each of said filter cells comprising a selectively transmissive filter of a first type and a selectively transmissive filter of a second type formed as four quadrants in an active area of said filter cell; and in each filter cell, said selectively transmissive filter of said first type occupies a first quadrant and a second quadrant diagonal from said first quadrant.

2. The image sensor of claim 1, wherein said two-dimensional array of pixel elements comprises a two-dimensional sensor array of digital pixels, each of said digital pixels outputting digital signals as pixel data.

3. The image sensor of claim 2, wherein each of said digital pixels comprises a photodetector generating an output signal; and said image sensor further comprises:
   a plurality of analog-to-digital conversion (ADC) circuits located within said array of pixel elements, each of said ADC circuits being connected to one or more photodetectors for converting said output signal to a digitized pixel voltage signal.

4. The image sensor of claim 1, wherein each of said pixel elements of said image sensor generates analog signals representative of said image as pixel data, and said image sensor further comprises an analog-to-digital converter for digitizing said analog signals.

5. The image sensor of claim 1, wherein said array of selectively transmissive filter comprises a CMYG (cyan, magenta, yellow, green) filter pattern, each filter cell having the transmissive filter of the first type and the transmissive filter of the second type selected from the CMYG filter pattern.

6. An image sensor, comprising:
   a sensor array comprising a two-dimensional array of pixel elements, said sensor array outputting digital signals as pixel data representing an image of a scene; and
   a two-dimensional array of selectively transmissive filters superimposed on said pixel elements of said sensor array, whereby each pixel element is disposed to capture a first and a second color spectra of visible light,
   wherein said two-dimensional array of selectively transmissive filters comprises a two-dimensional array of filter cells, each filter cell superimposed and in registration with each of said pixel elements, each of said filter cells comprising a selectively transmissive filter of a first type and a selectively transmissive filter of a second type formed as four quadrants in an active area of said filter cell; and in each filter cell, said selectively transmissive filter of said first type occupies a first quadrant and a second quadrant diagonal from said first quadrant.

7. The image sensor of claim 6, wherein each of said pixel elements comprises a photodetector generating an output signal; and said image sensor further comprises:
   a plurality of analog-to-digital conversion (ADC) circuits located within said sensor array, each of said ADC circuits being connected to one or more photodetectors for converting said output signal to a digitized pixel voltage signal.

* * * * *